United States Patent [19]
Corcoles et al.

[11] Patent Number: 5,226,827
[45] Date of Patent: Jul. 13, 1993

[54] TEST CONNECTOR

[75] Inventors: Vincent Corcoles, St. Martin D'Heres; Paul Davin, Seyssinet-Pariset; Frédéric Negrello, Fontaine, all of France

[73] Assignee: Merlin Gerin, France

[21] Appl. No.: 801,471

[22] Filed: Dec. 2, 1991

[30] Foreign Application Priority Data

Dec. 6, 1990 [FR] France ................ 90 15402

[51] Int. Cl.⁵ .................... H01R 13/44; H01R 11/18
[52] U.S. Cl. .................... 439/140; 439/482
[58] Field of Search ........... 439/137, 138, 139, 140, 439/141, 144, 345, 367, 370, 372, 482

[56] References Cited

U.S. PATENT DOCUMENTS

| | | | |
|---|---|---|---|
| 2,444,843 | 7/1948 | Modrey | 439/140 |
| 4,109,989 | 8/1978 | Snyder, Jr. et al. | 439/140 |
| 4,445,739 | 5/1984 | Wooten | 439/140 |
| 4,531,800 | 7/1985 | Avener | 339/75 P |
| 4,808,127 | 2/1989 | Swanic | 439/140 X |
| 5,030,119 | 7/1991 | Lowe | 439/141 |

FOREIGN PATENT DOCUMENTS

| | | |
|---|---|---|
| 0326098 | 8/1989 | European Pat. Off. . |
| 3000434 | 7/1981 | Fed. Rep. of Germany . |
| 3108523 | 9/1982 | Fed. Rep. of Germany . |
| 9005156 | 8/1990 | Fed. Rep. of Germany . |
| 1215909 | 4/1960 | France ................ 439/140 |
| 2179782 | 11/1972 | France . |

*Primary Examiner*—Gary F. Paumen
*Attorney, Agent, or Firm*—Parkhurst, Wendel & Rossi

[57] ABSTRACT

A test connector for connection to two test inputs of a trip device. The test connector includes a fixed component made of electrically insulating material, wherein the fixed component includes a sleeve defining an inner space. A movable component is provided within the inner space and is axially movable therein. The movable component includes a protruding portion which extends from the fixed component. A spring is provided between the movable component and the fixed component to provide a biasing force to urge the movable component in an outward axial direction. Two testing needles are housed within two longitudinal passages within the movable component. Upon insertion of the test connector into a recessed portion of a face of an electronic trip device, the movable component is urged rearwardly to expose the two testing needles which pass through orifices int he recessed portion to contact the two test inputs of the trip device.

8 Claims, 6 Drawing Sheets

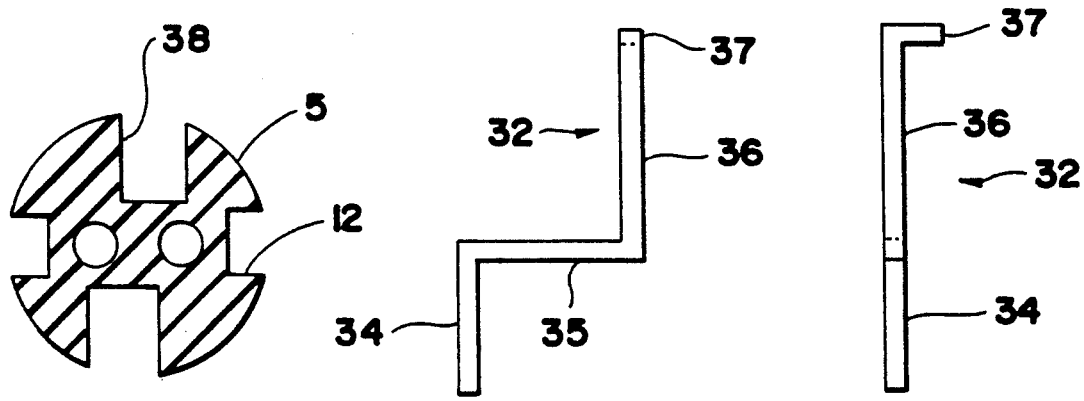
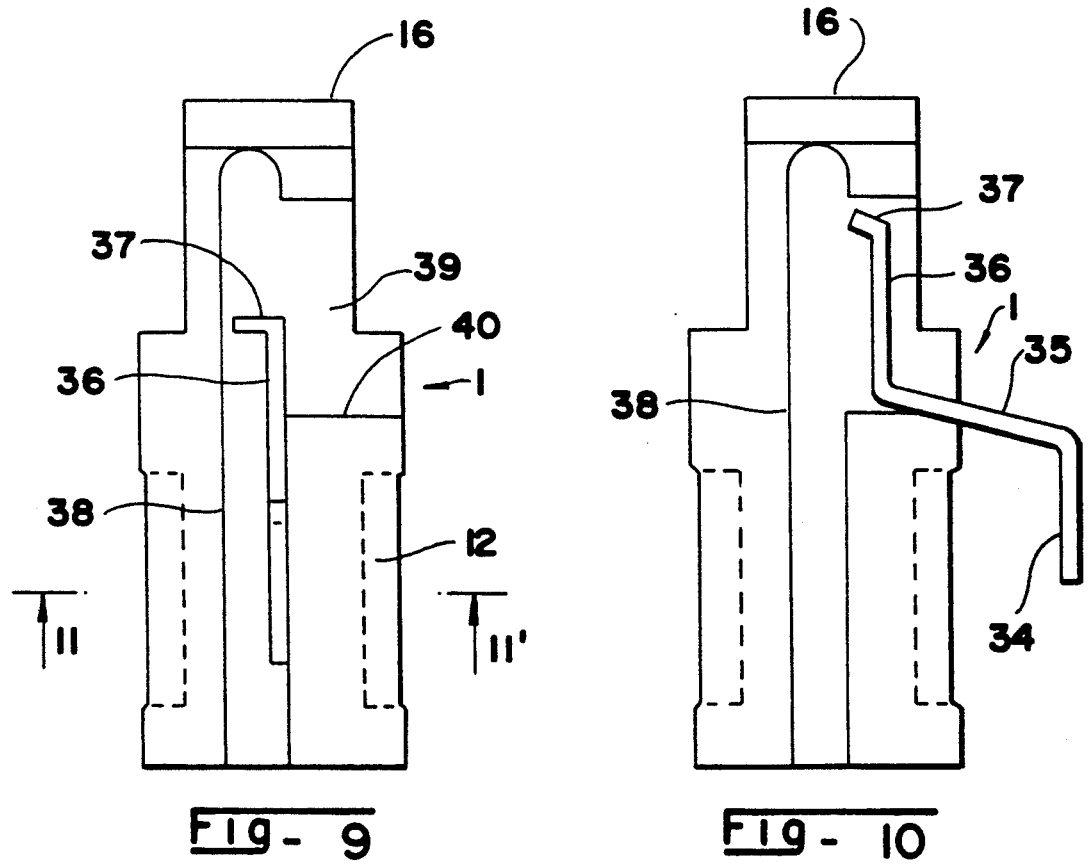

TEST CONNECTOR

BACKGROUND OF THE INVENTION

The invention relates to a test connector designed to be connected to a face of an electronic trip device so as to apply a current or voltage to two test inputs of the trip device.

In state-of-the-art trip devices, testing of the trip device is carried out after two test inputs have been connected to a test kit comprising a voltage or current source. Connection is normally made by connecting a male connector, which is securely affixed to the trip device, to a female connector which is connected by a cable to the test kit. The male connector comprises two pins, the end of which being appreciably flush with the front face of the trip device.

With this type of connection, it is difficult to insulate the test inputs correctly from the front face. In addition, the female connector, which is small, is not very easy to handle.

SUMMARY OF THE INVENTION

The object of the invention is to provide a test connector overcomes the drawbacks of prior art devices.

According to the invention, this object is achieved by a test connector comprising a fixed component made of insulating material, a moving component made of insulating material being able to move axially inside the fixed component, a flexible part biasing the moving component axially towards the outside of the fixed component, two test needles designed to be connected to a current or voltage source and securedly united to the fixed component, the top ends of the test needles being, in the disconnected position of the test connector, housed inside longitudinal passages passing through the moving component. The moving component comprises a bearing ledge designed to bear, in the connected position, against a complementary wall of the trip device face so as to compress the flexible part and move the moving component axially towards the inside of the fixed component. Thus, the ends of the test needles protrude from the moving component to contact, via two corresponding orifices of said insulating face of the trip device, conducting pads formed on a printed circuit constituting said test inputs.

The electrical contact between the male and female parts of the connector, i.e. between the test needles of the test connector and the pads of the trip device printed circuit, must be made away from the front face of the trip device. A very good insulation can thus be obtained with respect to the front face, in practice greater than 12 kV, and electrostatic discharge problems can be greatly limited. In addition, there is no risk of a user coming and touching a live part of the electronic trip device accidentally, the only access to the printed circuit card being via orifices of very small dimensions, designed only for the test needles to pass through. To give an example, the diameter of these orifices is less than 1 mm. It should be noted that the cost of the female part, formed by two pads on a printed circuit, is negligible. In addition, in the non-connected position the needles are withdrawn inside the moving part. The handler is therefore protected from direct contact with the live needles (withstand 1.5 kV).

According to a development of the invention, the bearing ledge is formed by the upper face of the moving component, the orifices being conical in shape and formed in the complementary wall of the trip device face. The use of conical orifices facilitates guiding of the needles during connection.

The test connector preferably comprises means for limiting the axial movement of the moving component with respect to the fixed component due to the action of the flexible part. These means can comprise at least one longitudinal groove formed in the moving component and comprising a ledge at the bottom, a complementary stop being securedly united to the fixed component.

Unlike state-of-the-art test connectors, the test connector according to the invention can comprise locking means designed to cooperate with complementary means of said trip device face.

The locking means preferably comprise at least one locking hook securedly united to a sheath, made of insulating material, surrounding the fixed component, the hook and sheath being able to perform limited rotation with respect to the fixed and moving components, a part of the hook coming and locking, in the locking position, on a complementary locking ledge of the trip device face.

According to a preferred embodiment, the moving component comprises at least one groove for housing the locking hook in the unlocked position.

BRIEF DESCRIPTION OF THE DRAWINGS

Other advantages and features will become more clearly apparent from the following description of an illustrative embodiment of the invention, given as a non-restrictive example only and represented in the accompanying drawings, in which:

FIG. 7 illustrates a locking hook, FIG. 8 being a right-hand side view of the hook in FIG. 7.

FIGS. 9 and 10 represent the respective positions of the moving component of the test connector and of a locking hook, respectively in the disconnected position and in the locking position.

FIG. 11 is a cross section along 11—11' (FIG. 9) of the moving component.

DESCRIPTION OF THE PREFERRED EMBODIMENT

Figure 1:
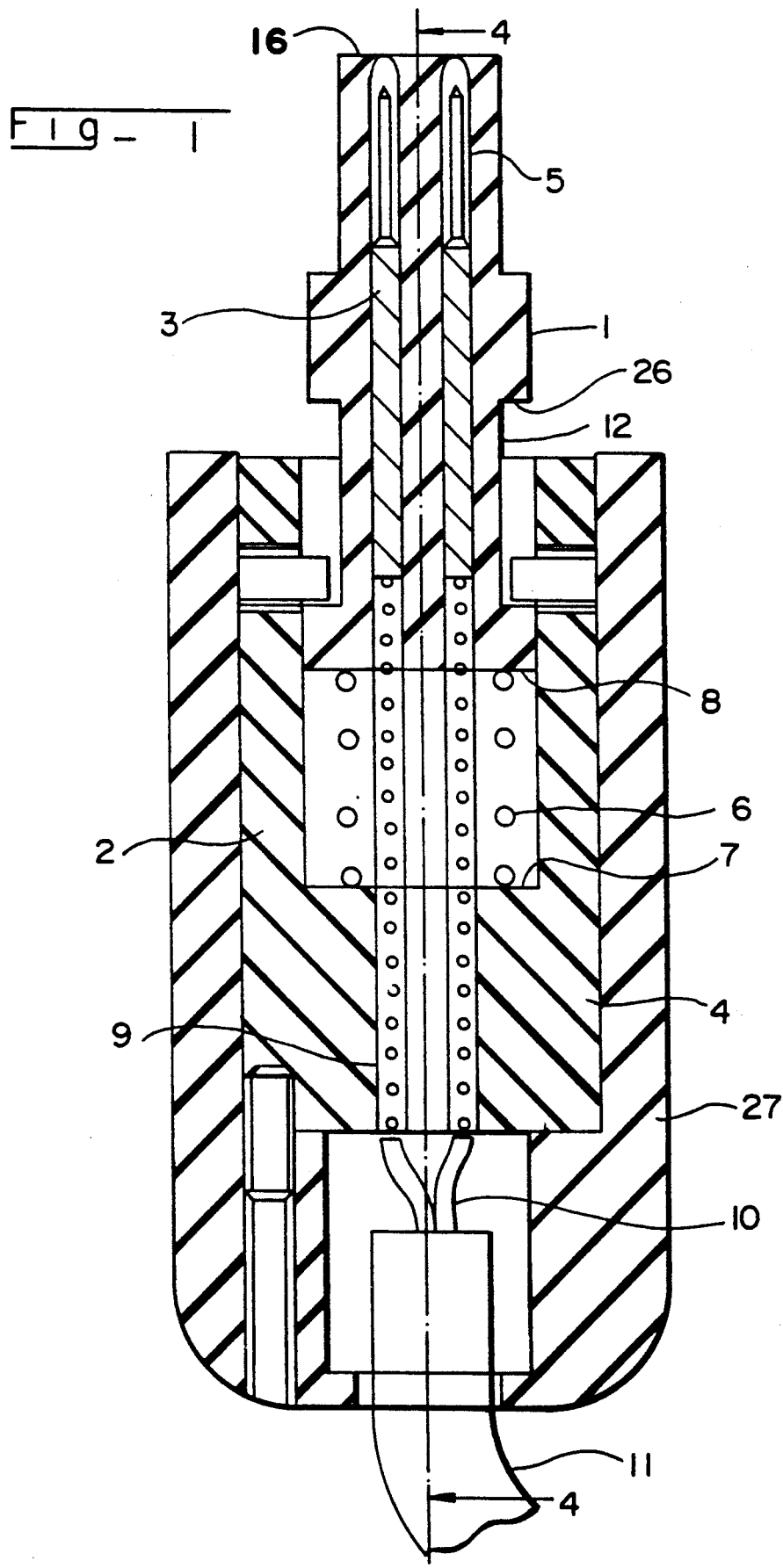
FIGS. 1 and 2 represent in cross section, a test connector disconnected and connected to the front face of a trip device, respectively.
Figure 2:
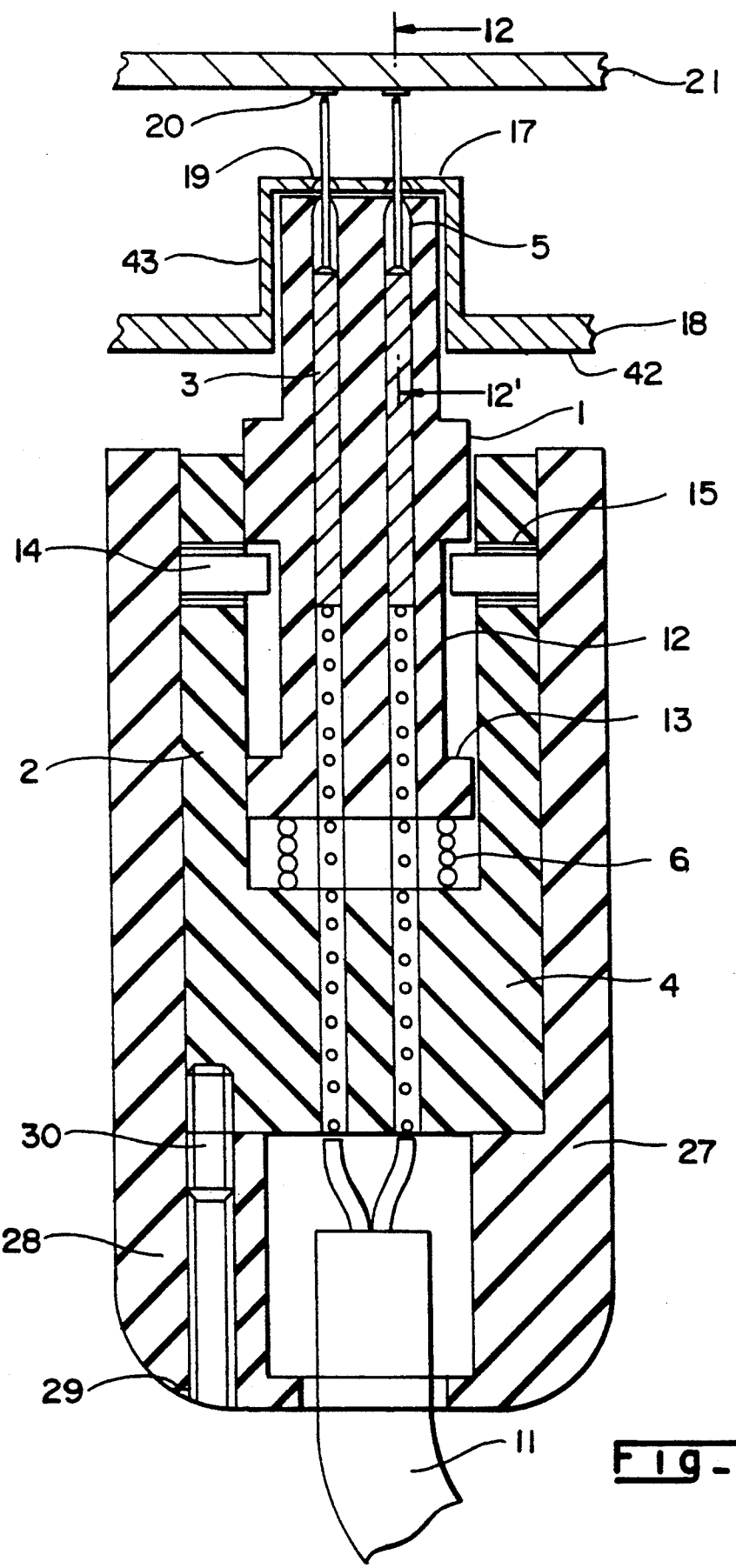

The test connector, illustrated in FIGS. 1 and 2, comprises a moving component 1 able to slide coaxially inside a fixed component 2, in the form of a sleeve. Two testing needles 3, securedly affixed to the base 4 of the fixed component 2, are engaged in parallel longitudinal passages 5 passing through the moving component 1. A compression spring 6, axially arranged between the top wall 7 of the base 4 and the bottom wall 8 of the moving component 1, normally biases the moving component 1 away from the base 4.

The testing needles 3 are fixed by any suitable means to the base 4 of the fixed component 2. In the embodiment represented, the bottom part of a needle is stuck in a cylindrical passage 9 passing longitudinally through the base 4. The bottom end of each needle is electrically connected, for example by soldering, to a conductor 10 of a cable 11, cable 11 being designed to connect the test connector to a test device (not shown) supplying a test current or voltage.

The moving component 1 comprises on its external wall at least one longitudinal groove 12 forming a ledge 13 at the bottom. When the test connector is not connected (FIG. 1), the ledge 13 is biased against a stop 14 securely united to, and protruding transversely into, fixed component 2. In the embodiment represented, the moving component comprises two symmetrical grooves 12, associated with two stops, formed by screws 14. The screws 14 are screwed into transverse tapped orifices 15 formed in the side wall of the fixed component 2. In the disconnected position, axial movement of the fixed component 1, due to the action of the spring 6, is limited by the ledges 13 of the moving component 1 coming up against the screws 14 securedly united to the fixed component 2.

The respective dimensions of the different components are such that in the disconnected position the top ends of the needles 3 are housed completely inside the passages 5. On the other hand (FIG. 2), when the top face 16 of the moving component 1 comes into contact with an insulating wall 17 of the front face 18 of a trip device to be tested, the spring 6 is compressed and the moving component 1 moves axially toward the base 4 of the fixed component 2. The top ends of the needles 3 then protrude from the passages 5 and pass through the wall 17 via orifices 19 to come into contact with pads 20 of a printed circuit 21 of the trip device. The test connector then forms the male part of the connector, the female part of which is very simple, being formed by two pads 20 of the printed circuit 21 of the trip device to be tested.

The orifices 19 in the wall 17 of the front face 18 are preferably conical, the narrow end of the orifices 19 being arranged inside, so as to guide of the needles 3.

Figure 3:
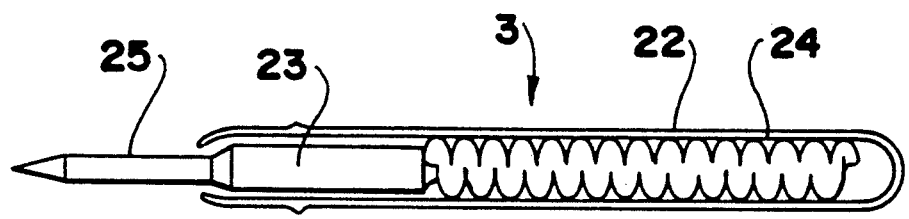
FIG. 3 illustrates a test needle of the test connector according to FIGS. 1 and 2.

The test needles 3 are conventional off-the-shelf type needles, for example of the type illustrated in FIG. 3. Each needle 3 comprises a body 22 in which a component 23, forming a piston, is biased outwards by the action of a compression spring 24. A tapered part 25, securely united to the piston 23, forms the end of the needle and protrudes from the body 22.

The dimensions of the various component parts are such that, when the test connector is connected, the maximum travel of the moving component 1 with respect to the fixed component 2 is slightly greater than the distance between the external face of the wall 17 and the face of the printed circuit 21 bearing the pads 20. Thus, upon connection, the end of a needle 3 coming into contact with a pad 20 results in the spring 24 of the needle being compressed. This ensures a good contact between the male and female parts, and as each needle comprises its own spring, it compensates for the tolerances of the various components making up the connector.

The maximum travel of the moving part with respect to the fixed part can be defined by a ledge 26 delimiting the top part of the groove 12. This maximum travel is defined by the ledge 26 coming up against a stop 14, which is preferably the same as the previous one.

The test connector may additionally include locking means designed to cooperate with complementary means of the front face 18 of the trip device to be tested.

In the embodiment represented in the Figures, the test connector comprises an external sheath 27, of general cylindrical shape, in which the fixed component 2, also of cylindrical shape, is inserted axially. The sheath is securely united axially to the fixed component, but can perform a limited rotation around their common axis. The bottom face of the base 4 of the fixed component comes into contact with the top face of the base 28 of the sheath. This base 28 comprises a passage for the cable 11. A mechanical device is provided to limit rotation of the sheath 27 with respect to the fixed component 2, and thus prevent the locking hook from being damaged. In the preferred embodiment represented in the Figures, the base 28 of the sheath comprises a longitudinal orifice 29 in which a stop 30 is arranged protruding inwards and cooperating with a groove 31 of the fixed component. The dimensions of the groove 31 fix the maximum angle of rotation of the sheath with respect to the fixed component. This angle is for example about to 30°.

Figure 4:
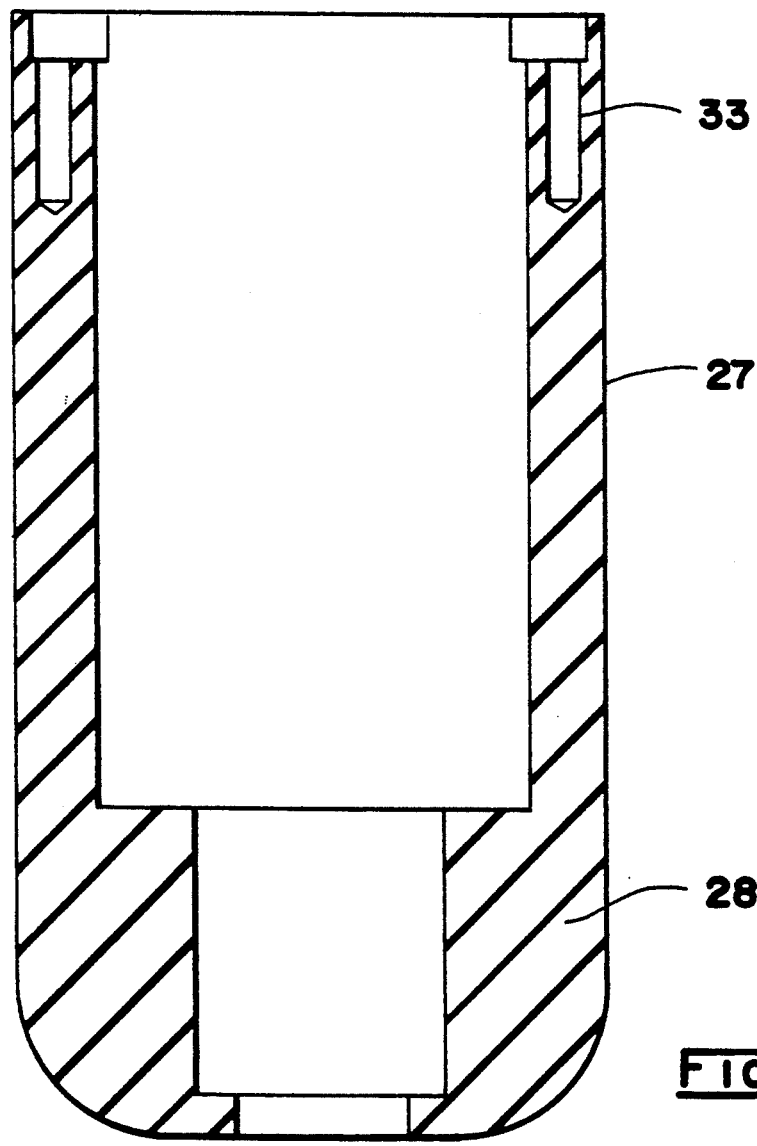
FIG. 4 represents, in cross section along 4—4' (FIG. 1), the sheath of the test connector according to FIGS. 1 and 2.
Figure 5:
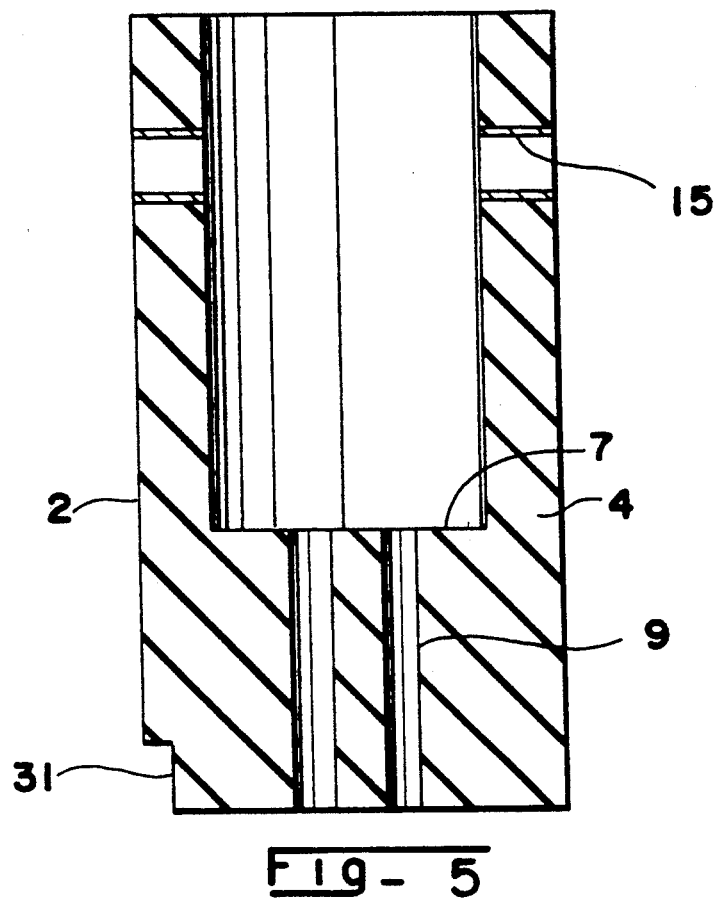
FIGS. 5 and 6 represent the fixed component of the test connector, respectively in cross section along 5—5' (FIG. 6) and in top view.
Figure 6:
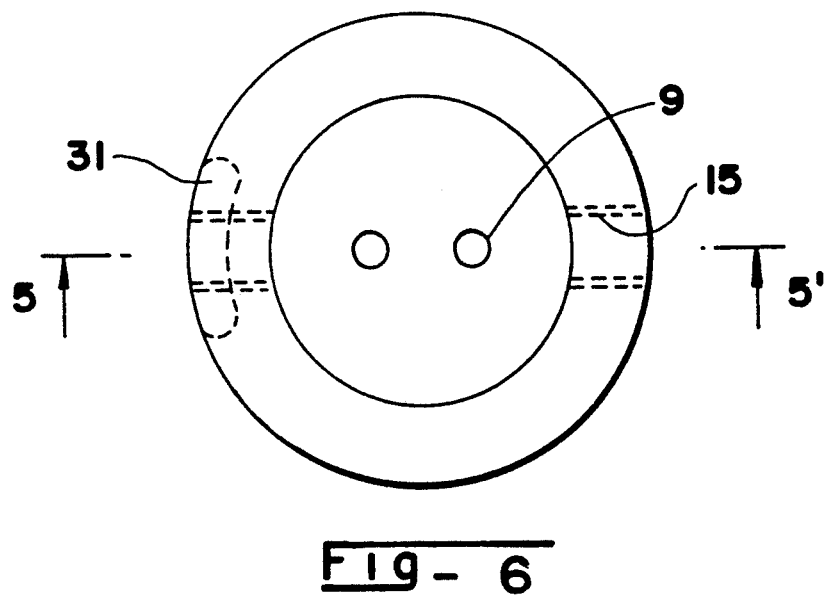

At least one locking hook 32 is securedly affixed to the sheath 27. A first end 34 of the hook is fixed in a longitudinal orifice 33 formed at the top part of the side wall of the sheath 27. In the embodiment represented in FIG. 4, the sheath 27 comprises two symmetrical orifices 33 with respect to its axis, designed for fixing two locking hooks 32 by any suitable means.

The hook 32 (FIGS. 7 and 8) comprises four parts 34 to 37, forming two brackets. The parts 34 and 36 are parallel and connected to each other by a part 35 which is perpendicular to parts 34 and 36.

The end 34 of the hook is fixed in the longitudinal orifice 33 of the sheath, and the part 35 is parallel to the upper face of the fixed component 2 and can be used to hold the latter axially inside the sheath 27.

In the disconnected position, the parts 35 and 36 of the locking hook 32 are engaged in a longitudinal groove 38 of the moving component 1, as represented in FIG. 9. The part 35 is parallel to the upper face of the fixed component 2 and the part 34 is fixed in an orifice 33 of the sheath 27.

The groove 38 emerges in a hollowed part 39 of the moving component 1, comprising a bottom ledge 40. When the test connector is connected, the hook 32 is moved to the locking position by rotation of the sheath 27 with respect to the fixed and moving components. The moving component 1 is securedly united in rotation with the fixed component by means of the stops 14 and grooves 12. The relative positions of the hook 32 and moving component in the locked position are represented in FIG. 10. The moving component has moved axially downwards with respect to the fixed component and the sheath, whose hook 32 is securedly affixed by its part 34. The part 35 passes above the plane of the ledge 40 and bears against the latter after rotation of the sheath 27. The part 37, parallel to the plane of FIG. 9, has performed a rotation with respect to this plane and protrudes out with respect to the plane of FIG. 10. This part 37 can, in this position, be locked on a complementary locking ledge 41 of the trip device front face, thus locking the test connector on the trip device.

Figure 12:
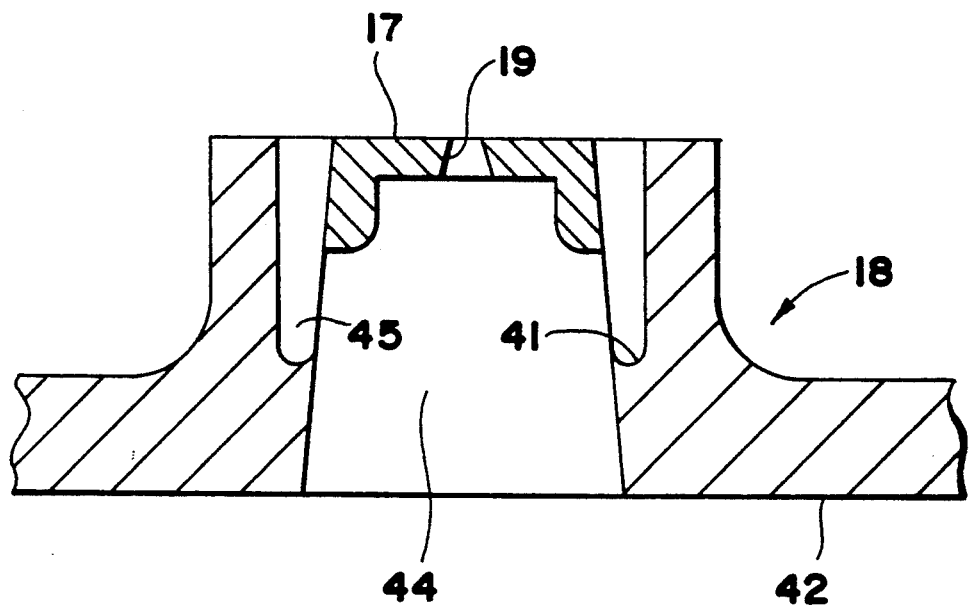
FIG. 12 is a cross section along 12—12' (FIG. 2) of the front face of a trip device on which the test connector is designed to be connected.

FIG. 12 illustrates in greater detail the part of the trip device front face 18 designed to cooperate with the test connector described above.

The wall 17 of the trip device front face 18, against which the upper face of the moving component 1 comes into contact, is recessed from the front wall 42 of the front face 18 to which it is joined by side walls 43 (FIG. 2), so as to form a cavity 44 in which the top end of the moving component is inserted. The cavity, which is non-cylindrical, has a complementary shape to that of the top part of the moving component. Recesses 45 are formed in at least one side wall of the cavity 44. In the embodiment represented, two recesses 45 are provided in two opposite walls, to cooperate with two locking hooks 32 of the test connector. Each recess comprises a locking ledge 41 behind which the part 37 of the associated hook comes into place when the test connector is locked.

Connection is therefore achieved very simply, first by the upper face of the moving part pressing on the wall 17 of the trip device front face. Then, the moving component is held in the non-cylindrical cavity 44 of the front face, a rotational movement of about 30° of the sheath with respect to the fixed and moving components results in the two locking hooks being released and coming into place behind the locking ledges 41. Disconnection is achieved by rotation in the opposite direction, performing unlocking, the fixed part then being removed from the front face cavity 44.

The invention is not limited to the particular embodiment represented in the Figures. In particular, other locking means can be provided, for example locking by friction between the moving component and a complementary part of the front face. Likewise, although it is preferable for the contact between the upper face of the moving component and the wall 17 to bring about compression of the spring 6 and movement of the moving part, this result can be obtained by other means, notably by contact between a bearing ledge of the moving part and a complementary wall of the front face. The fixed and moving components, of general cylindrical shape, and the sheath are naturally made of insulating material The sheath, made of machined material, can be sufficiently large to allow easy handling of the test connector.

We claim:

1. A test connector for connection to a recessed portion of a face of an electronic trip device to apply a test current or voltage to two test inputs of the trip device, comprising:
    a fixed component made of electrically insulating material and comprising a sleeve portion defining an inner space;
    a movable component made of electrically insulating material and being partially disposed within said sleeve portion of said fixed component such that said movable component is axially slidable within said sleeve portion, wherein said movable component comprises a protruding portion which axially protrudes from said fixed component, said movable component comprising two longitudinal passages which pass through said protruding portion;
    biasing means to provide a biasing force to urge said movable component in an outward axial direction away from said fixed component;
    two testing needles housed within said two longitudinal passages of said movable component, respectively, said two testing needles being secured to said fixed component, whereby upon insertion of said protruding portion of said movable component into the recessed portion of the face of the electronic trip device, said movable member is urged in an inward axial direction against said biasing force to allow end portions of said two testing needles to protrude from said protruding portion and pass through orifices in the recessed portion to contact the two test inputs, thereby defining a connected position of said test connector; and
    stop means for limiting movement of said movable component in said outward axial direction, said stop means including at least one longitudinal groove formed along an outer surface of said movable component, said at least one groove having one end defined by a bottom ledge of said movable component, and a stop fixed to said fixed component and protruding into said at least one longitudinal groove such that said stop contacts said bottom ledge to limit movement of said movable component in said outward axial direction.

2. The test connector of claim 1, wherein said biasing means comprises a spring.

3. A test connector for connection to a recessed portion of a face of an electronic trip device to apply a test current or voltage to two test inputs of the trip device, comprising:
    a fixed component made of electrically insulating material and comprising a sleeve portion defining an inner space;
    a movable component made of electrically insulating material and being partially disposed within said sleeve portion of said fixed component such that said movable component is axially slidable within said sleeve portion, wherein said movable component comprises a protruding portion which axially protrudes from said fixed component, said movable component comprising two longitudinal passages which pass through said protruding portion;
    biasing means to provide a biasing force to urge said movable component in an outward axial direction away from said fixed component;
    two testing needles housed within said two longitudinal passages of said movable component, respectively, said two testing needles being secured to said fixed component, whereby upon insertion of said protruding portion of said movable component into the recessed portion of the face of the electronic trip device, said movable member is urged in an inward axial direction against said biasing force to allow end portions of said two testing needles to protrude from said protruding portion and pass through orifices in the recessed portion to contact the two test inputs, thereby defining a connected position of said test connector; and
    spring means for allowing retraction of said end portions of said two testing needles in said inward axial direction.

4. The test connector of claim 3, wherein each of said two testing needles comprises:
    a needle body having an open end and a closed end;
    a piston member housed within said needle body;
    a spring for biasing said piston member toward said open end of said needle body, wherein said spring defines said spring means, and wherein said end portions of said two testing needles extend from said piston member, said end portions being tapered.

5. The test connector of claim 3, wherein said biasing means comprises a spring.

6. A test connector for connection to a recessed portion of a face of an electronic trip device to apply a test current or voltage to two test inputs of the trip device, comprising:
- a fixed component made of electrically insulating material and comprising a sleeve portion defining an inner space;
- a movable component made of electrically insulating material and being partially disposed within said sleeve portion of said fixed component such that said movable component is axially slidable within said sleeve portion, wherein said movable component comprises a protruding portion which axially protrudes from said fixed component, said movable component comprising two longitudinal passages which pass through said protruding portion;
- biasing means to provide a biasing force to urge said movable component in an outward axial direction away from said fixed component;
- two testing needles housed within said two longitudinal passages of said movable component, respectively, said two testing needles being secured to said fixed component, whereby upon insertion of said protruding portion of said movable component into the recessed portion of the face of the electronic trip device, said movable member is urged in an inward axial direction against said biasing force to allow end portions of said two testing needles to protrude from said protruding portion and pass through orifices in the recessed portion to contact the two test inputs, thereby defining a connected position of said test connector; and
- locking means for locking said test connector to said electronic trip device while said test connector is in said connected position, said locking means including at least one locking hook, and a sheath surrounding said fixed component, said locking hook being securely fixed to said sheath, whereby rotation of said sheath about said fixed component causes said hook to engage a complementary groove in the recessed portion of the face of the electronic trip device, thereby defining a locked position of said test connector.

7. The test connector of claim 6, wherein said movable component further comprises at least one groove and said locking hook is disposed within said groove to define an unlocked position, whereby rotation of said sheath defines said locked position.

8. The test connector of claim 6, wherein said biasing means comprises a spring.

* * * * *